United States Patent
Sah

(10) Patent No.: US 8,525,817 B2
(45) Date of Patent: Sep. 3, 2013

(54) PIXEL ARRAY MODULE AND FLAT DISPLAY APPARATUS

(75) Inventor: Wen-Jyh Sah, Tainan (TW)

(73) Assignee: Pervasive Display Co., Ltd., Tainan (TW)

( * ) Notice: Subject to any disclaimer, the term of this patent is extended or adjusted under 35 U.S.C. 154(b) by 1672 days.

(21) Appl. No.: 11/950,275

(22) Filed: Dec. 4, 2007

(65) Prior Publication Data

US 2008/0137166 A1    Jun. 12, 2008

(30) Foreign Application Priority Data

Dec. 6, 2006 (TW) .............................. 95145341 A
Dec. 6, 2006 (TW) .............................. 95145344 A

(51) Int. Cl.
    *G09G 5/00* (2006.01)
(52) U.S. Cl.
    USPC ........................... 345/204; 345/55; 349/151
(58) Field of Classification Search
    USPC ..... 345/55, 204–206, 87–104, 107; 313/500;
    359/245; 361/681, 749; 257/202, 211;
    349/149, 150, 151, 152
    See application file for complete search history.

(56) References Cited

U.S. PATENT DOCUMENTS

| 6,756,663 | B2 * | 6/2004 | Shiraishi et al. ............... 257/686 |
| 6,806,495 | B1 * | 10/2004 | Yamazaki et al. ............... 257/59 |
| 7,601,994 | B2 * | 10/2009 | Fukuchi et al. ................ 257/211 |
| 2004/0201551 | A1 * | 10/2004 | Suzuki et al. ................... 345/55 |
| 2008/0105875 | A1 * | 5/2008 | Maekawa et al. ............... 257/72 |

FOREIGN PATENT DOCUMENTS

| JP | 2006-113436 A | 4/2006 |
| TW | 200825589 | 6/2008 |
| TW | 200825596 | 6/2008 |

* cited by examiner

*Primary Examiner* — Tom Sheng
(74) *Attorney, Agent, or Firm* — Birch, Stewart, Kolasch & Birch, LLP

(57) ABSTRACT

A pixel array module includes a substrate, a pixel electrode array, a patterned conductive layer and a semiconductor circuit unit. The substrate has a first surface and a second surface opposite to the first surface. The pixel electrode array is disposed on the first surface of the substrate. The patterned conductive layer is disposed on the second surface of the substrate, and the patterned conductive layer is electrically connected to the pixel electrode array. The semiconductor circuit unit has at least one input terminal and at least one output terminal, which is electrically connected to the patterned conductive layer. A flat display apparatus is also disclosed.

43 Claims, 13 Drawing Sheets

PIXEL ARRAY MODULE AND FLAT DISPLAY APPARATUS

CROSS REFERENCE TO RELATED APPLICATIONS

This Non-provisional application claims priority under 35 U.S.C. §119(a) on Patent Application No(s). 095145341 and 095145344 filed in Taiwan, Republic of China both on Dec. 6, 2006, the entire contents of which are hereby incorporated by reference.

BACKGROUND OF THE INVENTION

1. Field of Invention

The invention relates to a pixel array module and a flat display apparatus.

2. Related Art

The development of the display technology makes the human beings easily receive a lot of information through the display apparatus and thus enriches the life of human beings. In addition, the information transfer speed is also increased.

FIG. 1 shows a conventional flat display apparatus, such as a liquid crystal display apparatus, which has a liquid crystal display panel 1. The liquid crystal display panel 1 mainly includes a pixel array 11, a scan line driving circuit 12 and a data line driving circuit 13. The pixel array 11 has a glass substrate $G_{01}$ and a plurality of thin film transistors $TFT_{01}$ disposed on the glass substrate $G_{01}$. The scan line driving circuit 12 is electrically connected to the gate of the thin film transistor $TFT_{01}$. The data line driving circuit 13 is electrically connected to the source of the thin film transistor $TFT_{01}$ to control the pixel transmission undertaken by the thin film transistor $TFT_{01}$. Furthermore, an image frame is constituted according to three primary colors (red, green and blue). The scan line driving circuit 12 and the data line driving circuit 13 are electrically connected to the pixel array 11 through a plurality of scan lines and a plurality of data lines, respectively. Therefore, the scan lines and the data lines have to be disposed on the glass substrate $G_{01}$. In order to prevent the scan lines and the data lines from influencing the image display quality of the liquid crystal display panel 1, however, a black matrix usually serves as a suitable shield. Thus, the black matrix lowers a portion of transmission, thereby decreasing the aperture ratio of the liquid crystal display panel 1 so that the best image display effect cannot be obtained.

Therefore, it is an important subject to provide a flat display apparatus that has an increased aperture ratio to enhance the displayed image quality.

SUMMARY OF THE INVENTION

In view of the foregoing, the invention is to provide a pixel array module and a flat display apparatus, which have a display surface capable of being completely used and have an increased aperture ratio to enhance the displayed image quality To achieve the above, the invention discloses a pixel array module including a substrate, a pixel electrode array, a patterned conductive layer and at least one semiconductor circuit unit. The substrate has a first surface and a second surface opposite to the first surface. The pixel electrode array is disposed on the first surface of the substrate. The patterned conductive layer is disposed on the second surface of the substrate and electrically connected to the pixel electrode array. The semiconductor circuit unit has at least one input terminal and at least one output terminal, which is electrically connected to the patterned conductive layer To achieve the above, the invention also discloses a flat display apparatus having a plurality of pixel array modules. Each pixel array module includes a substrate, a pixel electrode array, a patterned conductive layer and at least one semiconductor circuit unit. The substrate has a first surface and a second surface opposite to the first surface. The pixel electrode array is disposed on the first surface of the substrate. The patterned conductive layer is disposed on the second surface of the substrate and electrically connected to the pixel electrode array. The semiconductor circuit unit has at least one input terminal and at least one output terminal, which is electrically connected to the patterned conductive layer.

In addition, the invention also discloses a flat display apparatus including a substrate, a pixel electrode array, a patterned conductive layer, an auxiliary patterned conductive layer and at least one semiconductor circuit unit. The substrate has a first surface and a second surface opposite to the first surface. The pixel electrode array is disposed on the first surface of the substrate. The patterned conductive layer disposed on the first surface of the substrate. The auxiliary patterned conductive layer is disposed between the first surface and the second surface. In addition, the auxiliary patterned conductive layer is electrically connected to at least a portion of the pixel electrode array or the patterned conductive layer. The semiconductor circuit unit has at least one input terminal and at least one output terminal, which is electrically connected to the patterned conductive layer.

Moreover, the invention further discloses a flat display apparatus including a substrate, a pixel electrode array, a patterned conductive layer, an auxiliary patterned conductive layer and at least one semiconductor circuit unit. The substrate has a first surface and a second surface opposite to the first surface. The pixel electrode array is disposed on the first surface of the substrate. The patterned conductive layer is disposed on the first surface of the substrate. The auxiliary patterned conductive layer is disposed on the second surface and electrically connected to at least a portion of the pixel electrode array or the patterned conductive layer. The semiconductor circuit unit has at least one input terminal and at least one output terminal, which is electrically connected to the patterned conductive layer.

As mentioned above, in the pixel electrode array and the flat display apparatus according to the invention, the pixel electrode array and the patterned conductive layer are respectively disposed on two surfaces of the substrate. Accordingly, one surface of the substrate can be completely used as the display surface. Thus, the pixel electrode array can completely serve as the display surface without losing the aperture ratio so that the optimum image representation can be obtained.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
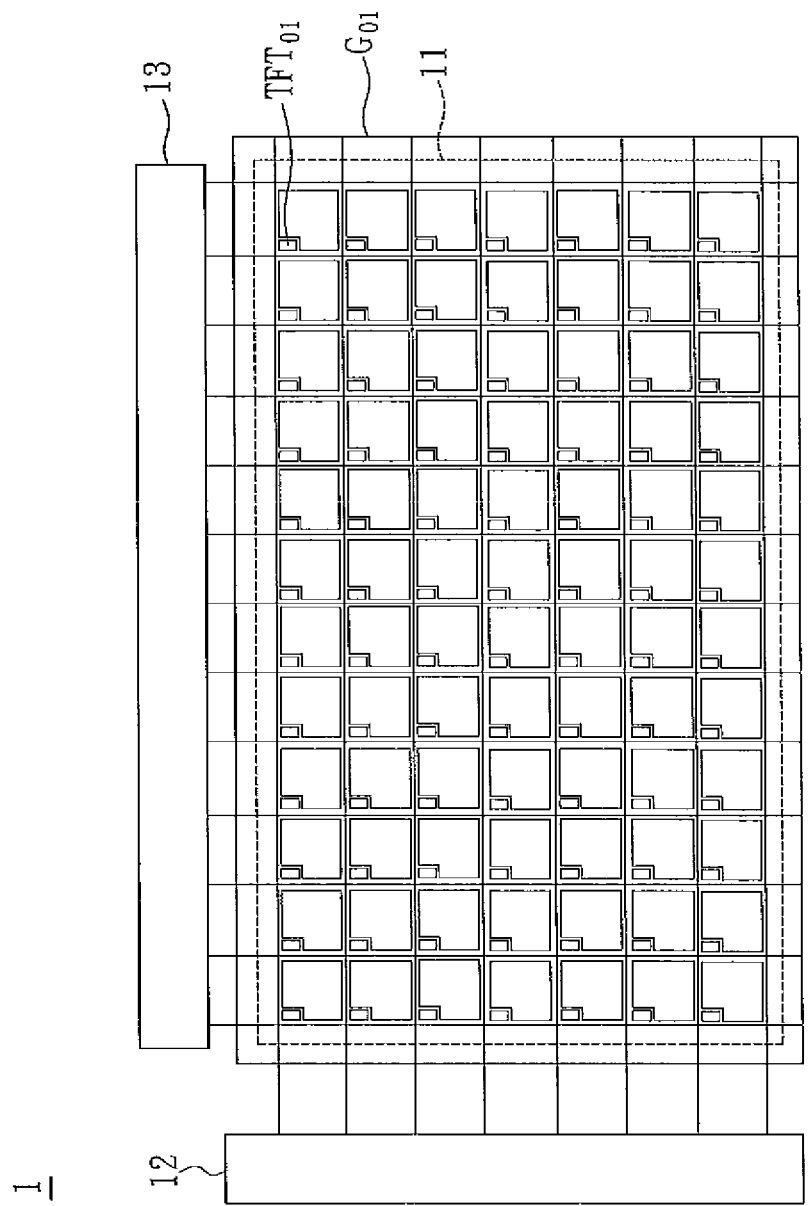
FIG. 1 is a schematic illustration showing a conventional flat display apparatus.
Figure 2:
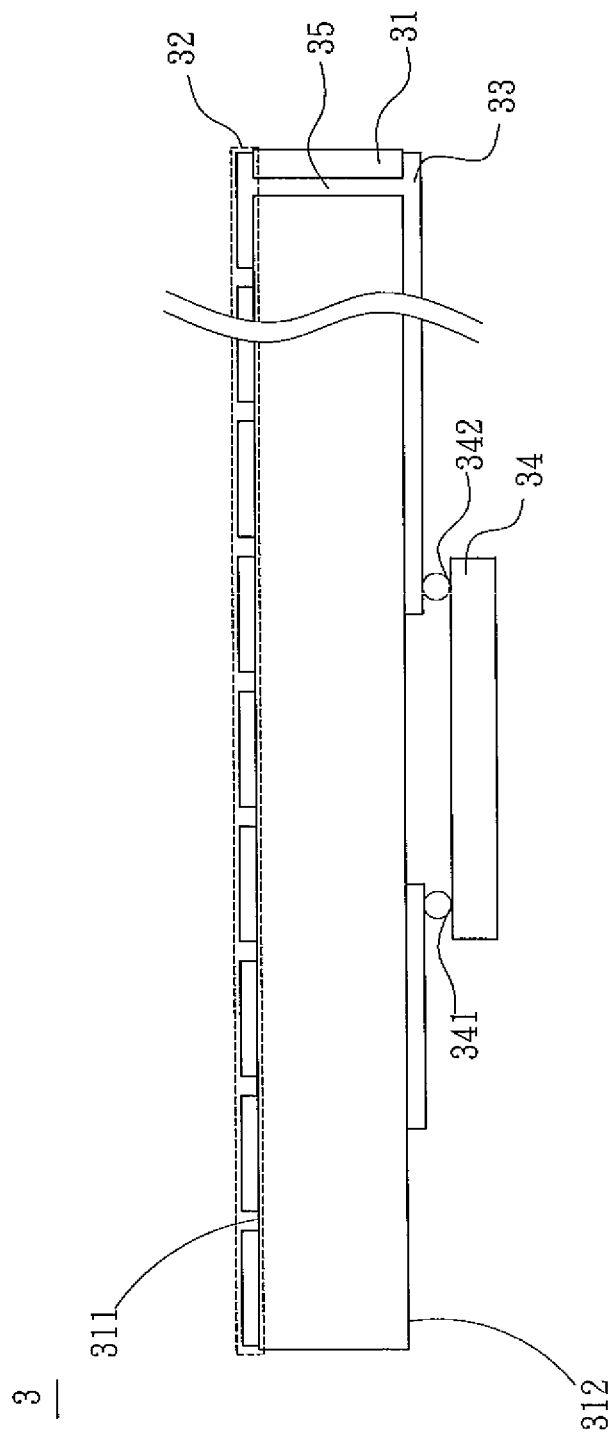
FIG. 2 is a schematic cross-sectional view showing a pixel array module according to a preferred embodiment of the invention.

Referring to FIG. 2, a pixel array module 3 according to a preferred embodiment of the invention includes a substrate 31, a pixel electrode array 32, a patterned conductive layer 33 and a semiconductor circuit unit 34.

The substrate 31 has a first surface 311 and a second surface 312 opposite to the first surface 311. The substrate 31 is a printed circuit board (PCB) or a flexible printed circuit (FPC). In this embodiment, the substrate 31 is, for example, a dual-side printed circuit board. Of course, the substrate 31 may also be a multi-layer printed circuit board.

The pixel electrode array 32 is disposed on the first surface 311 of the substrate 31 and includes a plurality of pixel electrodes arranged on the first surface 311 of the substrate 31 and in an array. In this embodiment, the material of the pixel electrode array 32 is a conductive material, such as metal, or a transparent conductive material, such as indium tin oxide without the limitative purpose. It is to be noted that each pixel electrode may be electrically connected to a transistor (not shown) in this embodiment.

The patterned conductive layer 33 is disposed on the second surface 312 of the substrate 31, and is electrically connected to the pixel electrode array 32 through the substrate 31. Herein, the pixel array module 3 farther includes an auxiliary patterned conductive layer 35, which is disposed between the first surface 311 and the second surface 312 of the substrate 31 and is electrically connected to the pixel electrode array 32 and the patterned conductive layer 33. In this embodiment, the auxiliary patterned conductive layer 35 may be disposed in a through hole of the substrate 31. In addition, the auxiliary patterned conductive layer 35 may includes a plurality of auxiliary patterned conductive sub-layers. It is to be noted that conductive wires, which are disposed between the first surface 311 and the second surface 312 of the substrate 31 and electrically connected to the pixel electrode array 32 and the patterned conductive layer 33, may be deemed as pertaining to the auxiliary patterned conductive layer 35 when the substrate 31 is either a dual-layer substrate or a multi-layer substrate.

The semiconductor circuit unit 34 is disposed on the second surface 312 of the substrate 31 and has at least one input terminal 341 and at least one output terminal 342, which is electrically connected to the patterned conductive layer 33. In this embodiment, the semiconductor circuit unit 34 is a multiplexer (MUX), which may be a chip. Of course, the semiconductor circuit unit 34 may also be composed of an integrated circuit and a transparent substrate, such as a glass substrate. The integrated circuit is directly formed on a surface of the transparent substrate, and is disposed opposite to and electrically connected to the patterned conductive layer 33.

In the embodiment, the integrated circuit can be formed on the surface of the transparent substrate by a manufacturing process of a thin-film transistor (TFT), such as an amorphous silicon TFT, a poly-silicon TFT, a low-temperature poly-silicon (LTPS) TFT or an organic TFT.

To be noted, the patterned conductive layer 33 may have a plurality of image inputting pads, the number of which is equal to that of the pixel electrodes. In addition, the semiconductor circuit unit 34 may have a plurality of image outputting pads, which are electrically connected with the corresponding image inputting pads, respectively. In addition, if the pixel array module 3 includes a plurality of semiconductor circuit units, the image outputting pads of each semiconductor circuit unit may be electrically connected to the corresponding image inputting pads. That is, each semiconductor circuit unit can control part of the pixel electrodes of the pixel electrode array 32.

Figure 3:
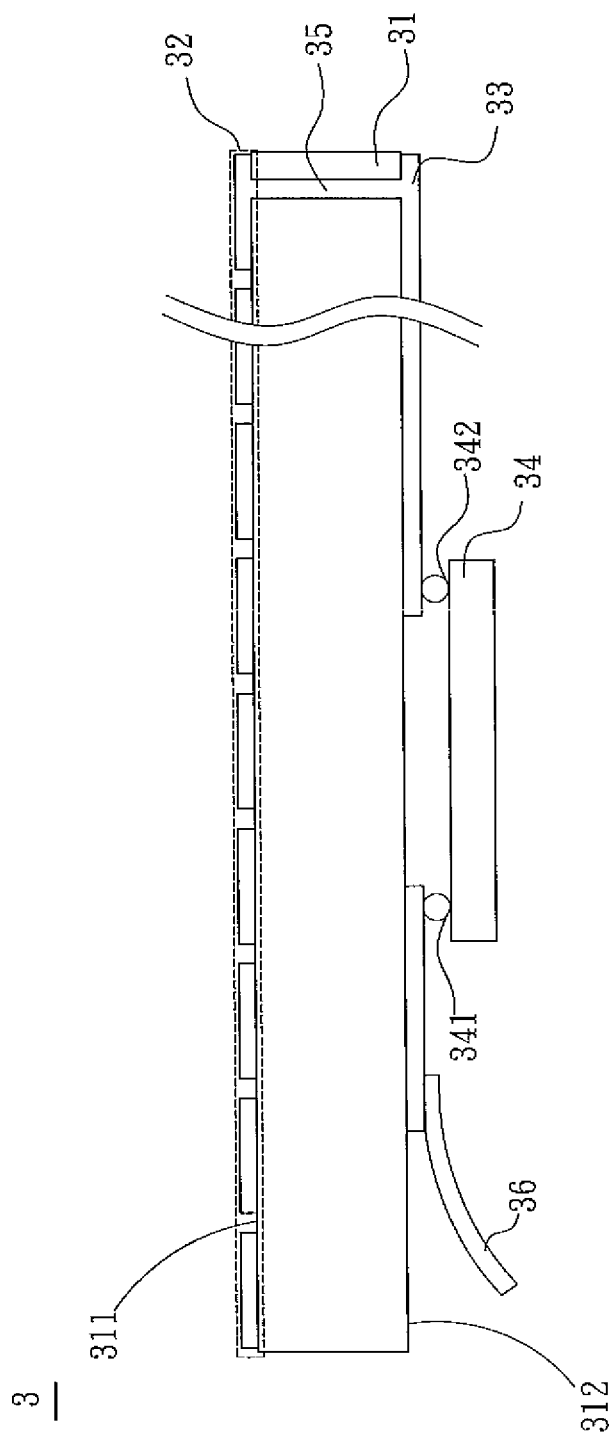
FIG. 3 is a schematic cross-sectional view showing the pixel array module including a flexible printed circuit according to the preferred embodiment of the invention.

Referring to FIG. 3, the pixel array module 3 may further include a flexible printed circuit 36 electrically connected to the input terminal 341 of the semiconductor circuit unit 34. In this embodiment, the flexible printed circuit 36 is electrically connected to the input terminal 341 of the semiconductor circuit unit 34 through a portion of the patterned conductive layer 33. Herein, the flexible printed circuit 36 inputs at least one driving signal to the semiconductor circuit unit 34, such as the multiplexer, and then the semiconductor circuit unit 34 transmits the driving signal to the pixel electrode array 32 through the patterned conductive layer 33, It is to be noted that the semiconductor circuit unit 34 may also be disposed on the patterned conductive layer 33 of the substrate 31 with a little displacement (not shown). In other words, a portion of the semiconductor circuit unit 34 projects from the substrate 31 so that the flexible printed circuit 36 may be directly electrically connected to the input terminal 341 of the semiconductor circuit unit 34.

Figure 4:
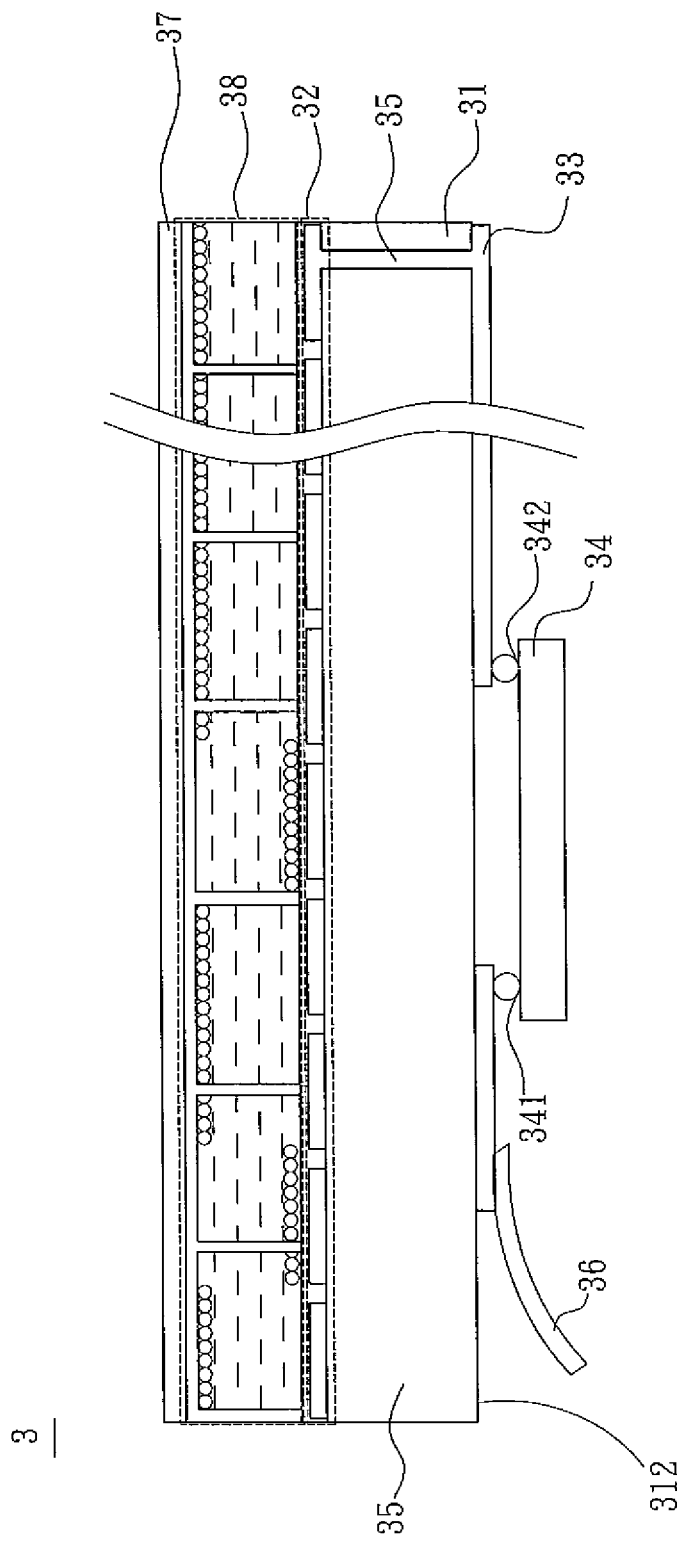
FIG. 4 is a schematic illustration showing the pixel array module including an opposing electrode and an opto-electronic display unit according to the preferred embodiment of the invention.

Referring to FIG. 4, the pixel array module 3 of this embodiment further includes an opposing electrode unit 37 and an opto-electronic display unit 38.

The opposing electrode unit 37 is disposed opposite to the pixel electrode array 32 and may be an electrode layer or an electrode board. In addition, the opposing electrode unit 37 has to be a transparent unit, so its material may be indium tin oxide, aluminum zinc oxide, indium zinc oxide or cadmium tin oxide.

The opto-electronic display unit 38 is disposed between the opposing electrode unit 37 and the pixel electrode array 32. The opto-electronic display unit 38 may be in the form of an opto-electronic display element or an opto-electronic display film. In this embodiment, the opto-electronic display unit 38 may include an electrophoresis material, an electrowetting material or a liquid crystal material such as a cholesteric liquid crystal. In addition, the size of the opto-electronic display unit 38 in this embodiment is substantially equal to that of the substrate 31, so the first surface 311 of the substrate 31 can completely serve as a display surface.

Figure 5:
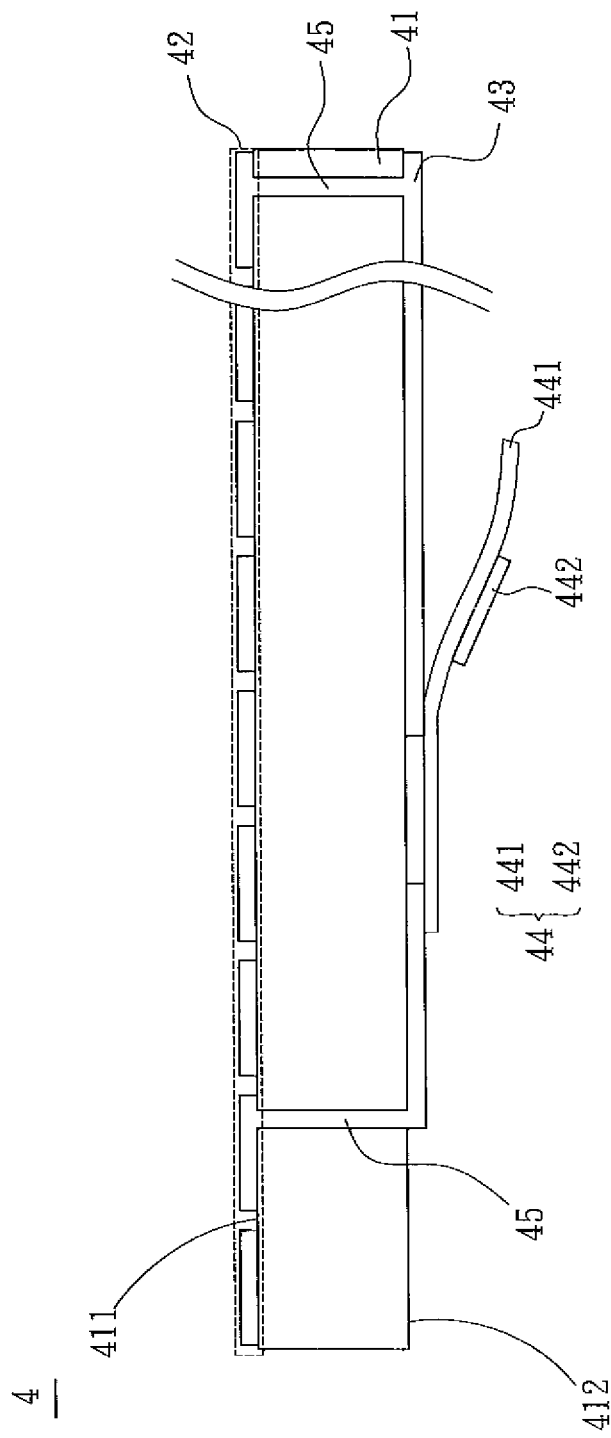
FIG. 5 is a schematic cross-sectional view showing another pixel array module according to the preferred embodiment of the invention.

Referring to FIG. 5, another pixel array module 4 according to the invention includes a substrate 41, a pixel electrode array 42, a patterned conductive layer 43, a semiconductor circuit unit 44 and an auxiliary patterned conductive layer 45. The structures and the effects of and the connections between the substrate 41, the pixel electrode array 42, the patterned conductive layer 43 and the auxiliary patterned conductive layer 45 are the same as the structures and the effects of and the connections between the substrate 31, the pixel electrode array 32, the patterned conductive layer 33 and the auxiliary patterned conductive layer 35, so detailed descriptions thereof will be omitted.

What is different from the semiconductor circuit unit 34 is that the semiconductor circuit unit 44 includes a film 441 and a chip 442, which may be disposed on the film 441 according to the chip-on-film (COF) technology, and is electrically connected to the patterned conductive layer 43 through the film 441. In one aspect, the chip 442 may be composed of an integrated circuit and a transparent substrate, such as a glass substrate. The integrated circuit is directly formed on a surface of the transparent substrate and then electrically connected to the patterned conductive layer 43 through the film 441.

The flat display apparatus according to a first embodiment of the invention will be described with reference to FIGS. 6A and 6B. The flat display apparatus is based on the pixel array module of the invention, so the associated symbols of the pixel array module, as shown in FIGS. 2 to 4, are the same as those of the flat display apparatus of the first embodiment.

Figure 6A:
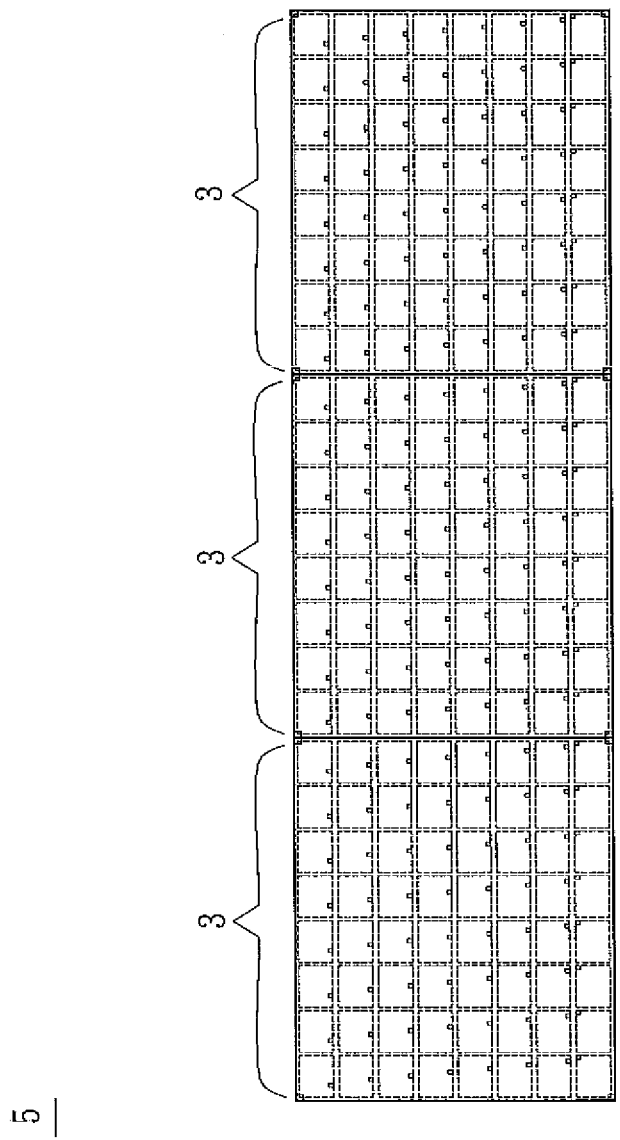
FIGS. 6A and 6B are schematic illustrations showing a flat display apparatus according to a first embodiment of the invention.
Figure 6B:
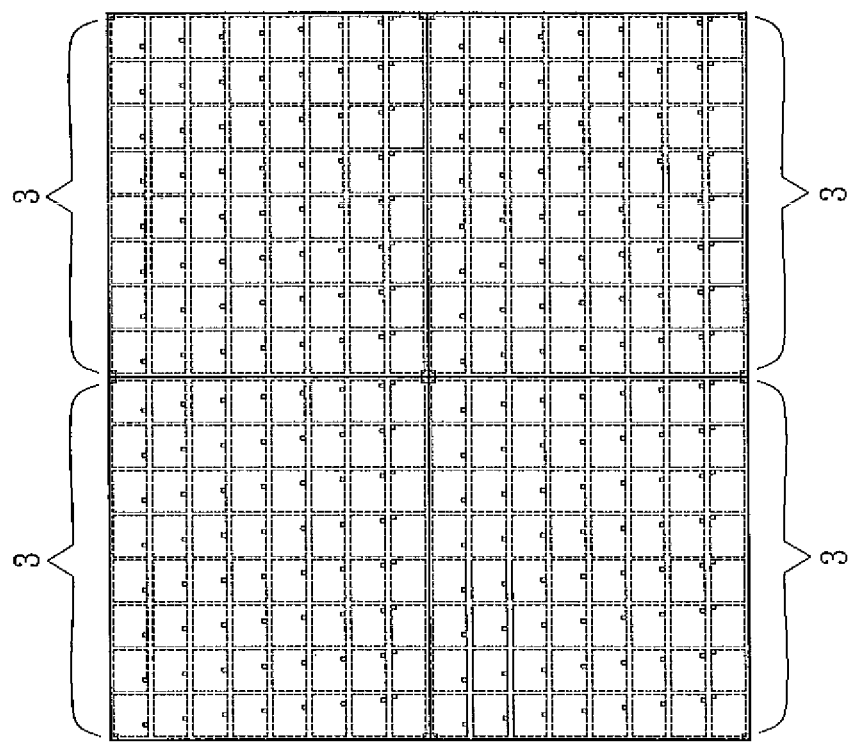

A flat display apparatus 5 according to the first embodiment of the invention has a plurality of pixel array modules 3 arranged in parallel, as shown in FIG. 6A, or arranged in an array, as shown in FIG. 6B. Of course, the single pixel array module 3 may also constitute the flat display apparatus, so the number of the pixel array module(s) 3 is not particularly restricted.

It is to be noted that the flat display apparatus 5 is not limited to the display apparatus for a typical monitor or television, and the flat display apparatus 5 may also be an outdoor billboard.

As shown in FIGS. 6A and 6B, the size of the substrate 31 of the pixel array module 3 is substantially equal to that of the opto-electronic display unit 38. Thus, no matter when the pixel array modules 3 are arranged in parallel or in an array, the display surfaces thereof may be tightly combined together so that the optimum image display effect can be obtained.

Figure 7:
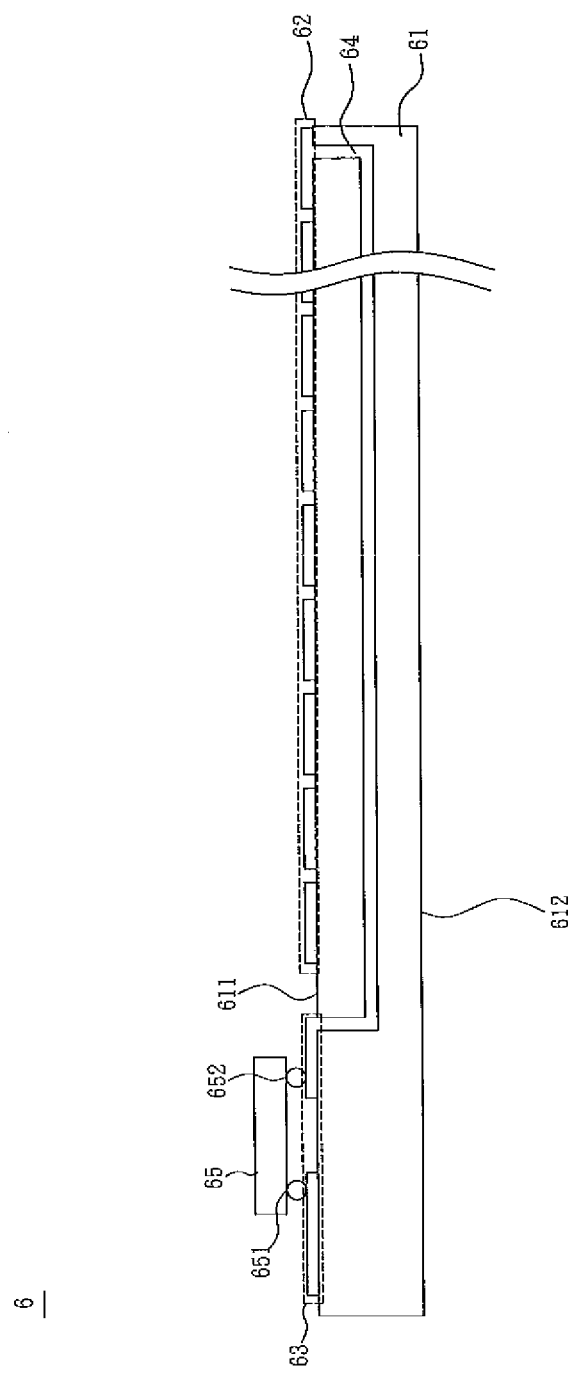
FIG. 7 is a schematic illustration showing a flat display apparatus according to a second embodiment of the invention.

Referring to FIG. 7, a flat display apparatus 6 according to a second embodiment of the invention includes a substrate 61, a pixel electrode array 62, a patterned conductive layer 63, an auxiliary patterned conductive layer 64 and a semiconductor circuit unit 65. The flat display apparatus 6 includes, without limitation to, an electrophoresis display apparatus, an electrowetting display apparatus or an outdoor billboard.

The substrate 61 has a first surface 611 and a second surface 612 opposite to the first surface 611. In this embodiment, the substrate 61 is similar to the substrate 31 of the above-mentioned embodiment, so detailed descriptions thereof will be omitted.

The pixel electrode array 62 and the patterned conductive layer 63 are disposed on the first surface 611 of the substrate 61. The pixel electrode array 62 includes a plurality of pixel electrodes arranged in an array and on the first surface 611 of the substrate 61. In this embodiment, the material of the pixel electrode array 62 and the material of the patterned conductive layer 63 are the same as that of the pixel electrode array 32 and that of the patterned conductive layer 33.

The auxiliary patterned conductive layer 64 is disposed between the first surface 611 and the second surface 612 of the substrate 61 and is electrically connected to a portion of the pixel electrode array 62 and a portion of the patterned conductive layer 63. In addition, the auxiliary patterned conductive layer 64 may includes a plurality of auxiliary patterned conductive sub-layers.

The semiconductor circuit unit 65 is disposed on the first surface 611 of the substrate 61 and has at least one input terminal 651 and at least one output terminal 652. Herein, the output terminal 652 is electrically connected to at least one portion of the patterned conductive layer 63. Of course, the input terminal 651 may also be electrically connected to at least one portion of the patterned conductive layer 63.

To be noted, the patterned conductive layer 63 may have a plurality of image inputting pads, the number of which is equal to that of the pixel electrodes. In addition, the semiconductor circuit unit 65 may have a plurality of image outputting pads, which are electrically connected with the corresponding image inputting pads, respectively. In addition, if the flat display apparatus 6 includes a plurality of semiconductor circuit units, the image outputting pads of each semiconductor circuit unit may be electrically connected to the corresponding image inputting pads. That is, each semiconductor circuit unit can control part of the pixel electrodes of the pixel electrode array 62.

The above-mentioned substrate 61, pixel electrode array 62, patterned conductive layer 63, auxiliary patterned conductive layer 64 and semiconductor circuit unit 65 can be integrated in a pixel array module. Moreover, if the flat display apparatus 6 includes a plurality of pixel array modules, the pixel array modules are arranged in an array.

Figure 8:
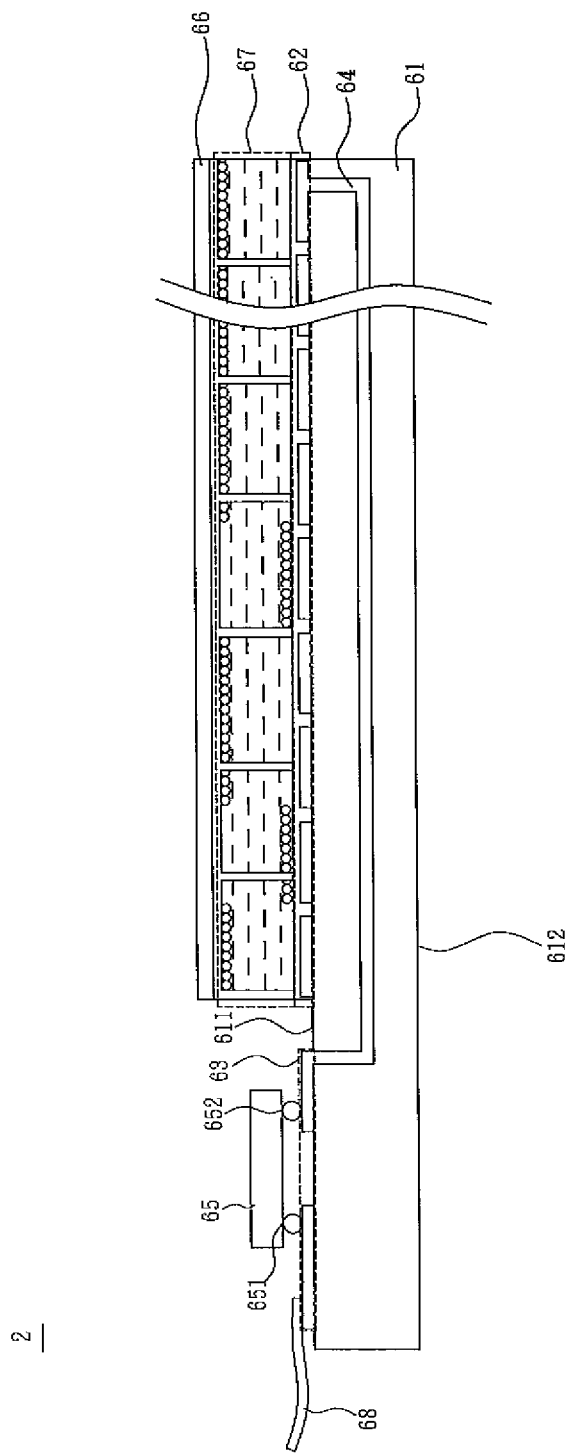
FIG. 8 is a schematic illustration showing another flat display apparatus according to the second embodiment of the invention.

Referring to FIG. 8, the flat display apparatus 6 of this embodiment further includes an opposing electrode unit 66, an opto-electronic display unit 67 and a flexible printed circuit 68.

The features and the structures of and the connections between the opposing electrode unit 66 and the opto-electronic display unit 67 are the same as the features and the structures of and the connections between the opposing electrode unit 37 and the opto-electronic display unit 38, so detailed descriptions thereof will be omitted.

It is to be specified that the flexible printed circuit 68 is electrically connected to the input terminal 651 of the semiconductor circuit unit 65. In this embodiment, the flexible printed circuit 68 is electrically connected to the input terminal 651 of the semiconductor circuit unit 65 through a portion of the patterned conductive layer 63. Herein, the flexible printed circuit 68 inputs at least one driving signal to the semiconductor circuit unit 65, such as a multiplexer, and then the semiconductor circuit unit 65 transmits the driving signal to the pixel electrode array 62 through a portion of the patterned conductive layer 63.

It is to be noted that the semiconductor circuit unit 65 may also be disposed on the patterned conductive layer 63 of the substrate 61 with a little displacement (not shown). In other words, the semiconductor circuit unit 65 partially projects from the substrate 61. Consequently, the flexible printed circuit 68 may be directly electrically connected to the input terminal 651 of the semiconductor circuit unit 65.

Figure 9:
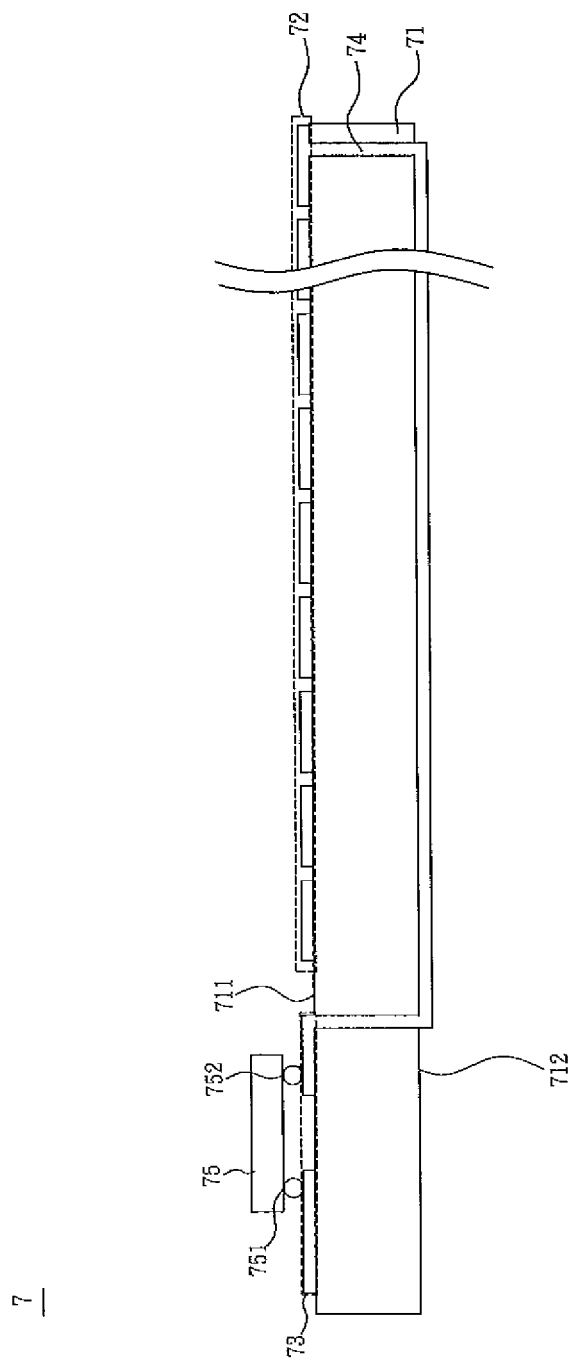
FIG. 9 is a schematic illustration showings a flat display apparatus according to a third embodiment of the invention.

Referring to FIG. 9, a flat display apparatus 7 according to a third embodiment of the invention includes a substrate 71, a pixel electrode array 72, a patterned conductive layer 73, an auxiliary patterned conductive layer 74 and a semiconductor circuit unit 75.

To be noted, the patterned conductive layer 73 may have a plurality of image inputting pads, the number of which is equal to that of the pixel electrodes of the pixel electrode array 72. In addition, the semiconductor circuit unit 75 may have a plurality of image outputting pads, which are electrically connected with the corresponding image inputting pads, respectively. In addition, if the flat display apparatus 7 includes a plurality of semiconductor circuit units, the image outputting pads of each semiconductor circuit unit may be electrically connected to the corresponding image inputting pads. That is, each semiconductor circuit unit can control part of the pixel electrodes of the pixel electrode array 72.

The above-mentioned substrate 71, pixel electrode array 72, patterned conductive layer 73, auxiliary patterned conductive layer 74 and semiconductor circuit unit 75 can be integrated in a pixel array module. Moreover, if the flat display apparatus 7 includes a plurality of pixel array modules, the pixel array modules are arranged in an array.

What is different from the second embodiment is that the auxiliary patterned conductive layer 74 is disposed on a second surface 712 of the substrate 71, penetrates through the substrate 71 and is electrically connected to the pixel electrode array 72 and the patterned conductive layer 73 disposed on a first surface 711 of the substrate 71. In this embodiment, the auxiliary patterned conductive layer 74 is electrically connected to the pixel electrode array 72 and the patterned conductive layer 73 through at least one through hole disposed on the substrate 71. What is the same as the second embodiment is that conductive wires, which are disposed between the first surface 711 and the second surface 712 of the substrate 71 and electrically connected to the pixel electrode array 72 and the patterned conductive layer 73, may be deemed as pertaining to the auxiliary patterned conductive layer 74 when the substrate 71 is either a dual-layer substrate or a multi-layer substrate.

Figure 10:
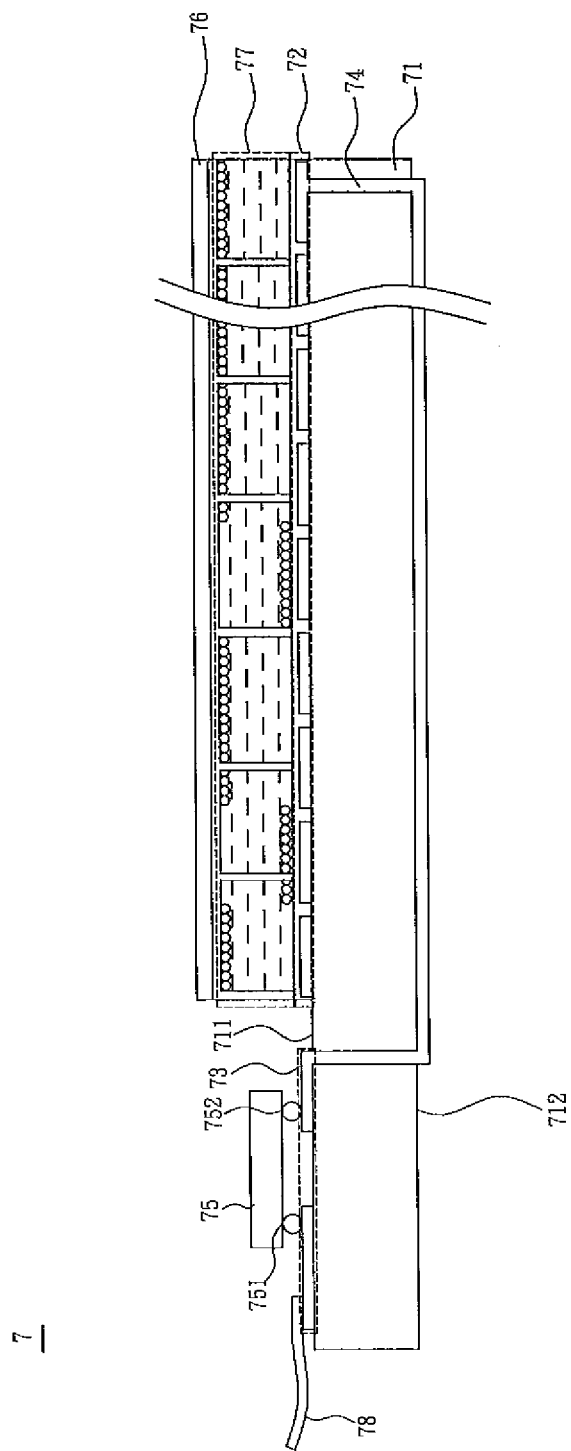
FIG. 10 is a schematic illustration showing another flat display apparatus according to the third embodiment of the invention.

Referring also to FIG. 10, the flat display apparatus 7 of this embodiment may also include an opposing electrode unit 76, an opto-electronic display unit 77 and a flexible printed circuit 78. The structures of and the connections between the opposing electrode unit 76, the opto-electronic display unit 77 and the flexible printed circuit 78 are the same as the structures of and the connections between the opposing electrode unit 66, the opto-electronic display unit 67 and the flexible printed circuit 68, so detailed descriptions thereof will be omitted.

Other flat display apparatuses according to other aspects of the second and third embodiments of the invention will be described with reference to FIGS. 11A and 11B.

Figure 11A:
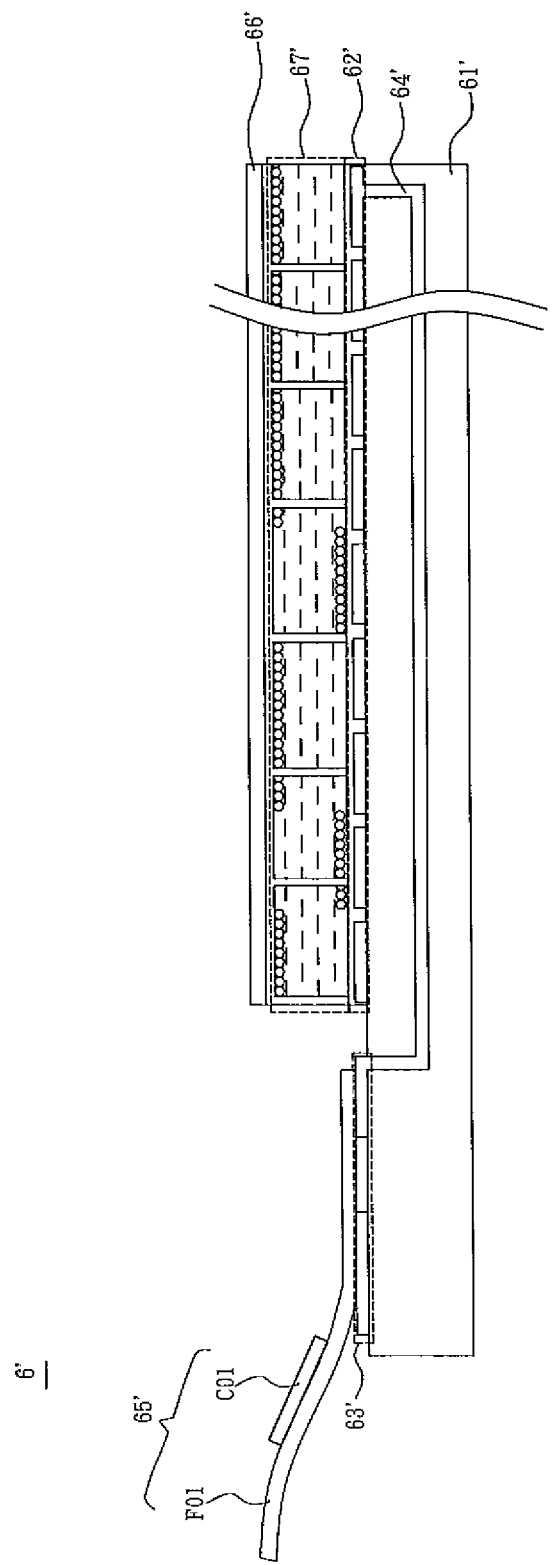
FIG. 11A is a schematic illustration showing still another flat display apparatus according to the second embodiment of the invention.

Referring to FIG. 11A, a flat display apparatus 6' includes a substrate 61', a pixel electrode array 62', a patterned conductive layer 63', an auxiliary patterned conductive layer 64', a semiconductor circuit unit 65', an opposing electrode unit 66' and an opto-electronic display unit 67'. What is different from the aspect of the second embodiment is that the semiconductor circuit unit 65' includes a film F01 and a chip C01. The chip C01 is disposed on the film F01 according to the COF technology, and is electrically connected to at least one portion of the patterned conductive layer 63' through the film F01. In this aspect of this embodiment, the chip C01 may also be composed of an integrated circuit and a transparent substrate, such as a glass substrate. The integrated circuit is directly formed on a surface of the transparent substrate, and then electrically connected to the patterned conductive layer 63' through the film F01.

In the embodiment, the integrated circuit can be formed on the surface of the transparent substrate by a manufacturing process of a thin-film transistor (TFT), such as an amorphous silicon TFT, a poly-silicon TFT, a low-temperature poly-silicon (LTPS) TFT or an organic TFT.

Figure 11B:
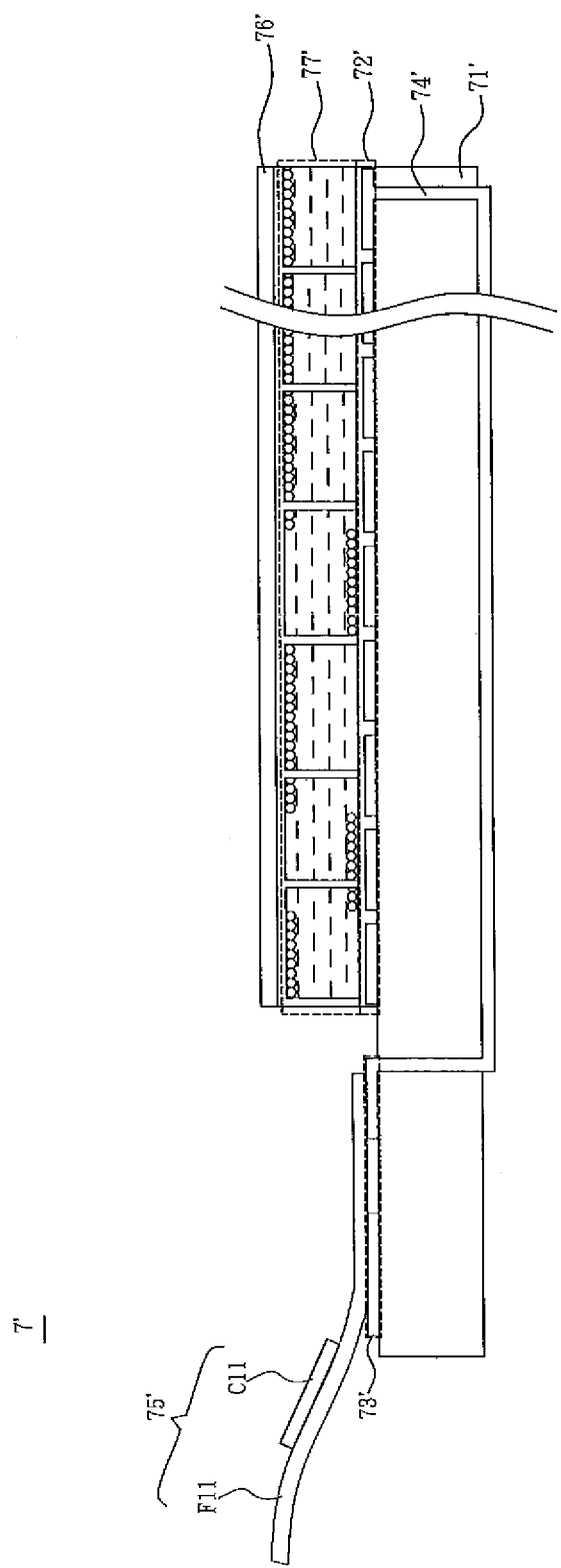
FIG. 11B is a schematic illustration showing still another flat display apparatus according to the third embodiment of the invention.

Referring to FIG. 11B, a flat display apparatus 7' includes a substrate 71', a pixel electrode array 72', a patterned conductive layer 73', an auxiliary patterned conductive layer 74', a semiconductor circuit unit 75', an opposing electrode unit 76' and an opto-electronic display unit 77'. What is different from the aspect of the third embodiment is that the semiconductor circuit unit 75' includes a film F11 and a chip C11. Similarly, the chip C11 is disposed on the film F11 according to the COF technology and electrically connected to at least one portion of the patterned conductive layer 73' through the film F11. In this aspect of this embodiment, the chip C11 may also be composed of an integrated circuit and a transparent substrate, such as a glass substrate. The integrated circuit is directly formed on a surface of the transparent substrate, and is electrically connected to the patterned conductive layer 73' through the film F11.

In the embodiment, the integrated circuit can be formed on the surface of the transparent substrate by a manufacturing process of a thin-film transistor (TFT), such as an amorphous silicon TFT, a poly-silicon TFT, a low-temperature poly-silicon (LTPS) TFT or an organic TFT.

In summary, the pixel electrode array and the flat display apparatus according to the invention have the following features. The pixel electrode array and the patterned conductive layer are respectively disposed on two surfaces of the substrate, the auxiliary patterned conductive layer is disposed between the first surface and the second surface of the substrate, or the auxiliary patterned conductive layer is disposed on the second surface of the substrate. In addition, the pixel electrode array is electrically connected to the semiconductor circuit unit through the auxiliary patterned conductive layer and the patterned conductive layer. Thus, the opto-electronic display unit corresponding to the pixel electrode array can completely serve as the display surface without losing the aperture ratio so that better image representation can be obtained.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A pixel array module, comprising:
   a substrate having a first surface and a second surface opposite to the first surface;
   a pixel electrode array disposed on the first surface of the substrate;
   a patterned conductive layer disposed on the second surface of the substrate and electrically connected to the pixel electrode array;
   at least a semiconductor circuit unit having at least one input terminal and at least one output terminal, wherein the output terminal is electrically connected to the patterned conductive layer; and
   an auxiliary patterned conductive layer electrically connected to the pixel electrode array and the patterned conductive layer,
   wherein the auxiliary patterned conductive layer is disposed between the first surface and the second surface of the substrate.

2. The pixel array module according to claim 1, wherein the semiconductor circuit unit is disposed on the second surface of the substrate.

3. The pixel array module according to claim 1, wherein the patterned conductive layer has a plurality of image inputting pads, and a number of the image inputting pads is equal to a number of a plurality of pixel electrodes of the pixel electrode array.

4. The pixel array module according to claim 3, wherein the semiconductor circuit unit has a plurality of image outputting pads electrically connected with the corresponding image inputting pads, respectively.

5. The pixel array module according to claim 1, wherein the semiconductor circuit unit comprises a chip.

6. The pixel array module according to claim 5, wherein the semiconductor circuit unit further comprises a film, and the chip is disposed on the film and is electrically connected to the patterned conductive layer through the film.

7. The pixel array module according to claim 1, wherein the semiconductor circuit unit comprises:
   a transparent substrate having a surface; and
   an integrated circuit formed on the surface of the transparent substrate and electrically connected to the patterned conductive layer.

8. The pixel array module according to claim 7, wherein the transparent substrate is a glass substrate.

9. The pixel array module according to claim 7, wherein the semiconductor circuit unit further comprises a film, the transparent substrate is disposed over the film, and the integrated circuit is electrically connected to the patterned conductive layer through the film.

10. The pixel array module according to claim 1, wherein the substrate is a printed circuit board (PCB) or a flexible printed circuit (FPC).

11. The pixel array module according to claim 1, wherein the auxiliary patterned conductive layer comprises a plurality of auxiliary patterned conductive sub-layers.

12. The pixel array module according to claim 1, further comprising a flexible printed circuit electrically connected to the input terminal of the semiconductor circuit unit.

13. The pixel array module according to claim 1, further comprising:
   an opposing electrode unit disposed opposite to the pixel electrode array of the substrate;
   and an opto-electronic display unit disposed between the opposing electrode unit and the pixel electrode array.

14. The pixel array module according to claim 13, wherein a size of the substrate is substantially equal to a size of the opto-electronic display unit.

15. The pixel array module according to claim 13, wherein the opto-electronic display unit comprises an electrophoresis material or an electrowetting material or a liquid crystal material.

16. A flat display apparatus, comprising:
   a substrate having a first surface and a second surface opposite to the first surface;
   a pixel electrode array disposed on the first surface of the substrate;
   a patterned conductive layer disposed on the first surface of the substrate;
   an auxiliary patterned conductive layer disposed between the first surface and the second surface, wherein the auxiliary patterned conductive layer is electrically connected to the pixel electrode array and the patterned conductive layer; and
   at least a semiconductor circuit unit having at least one input terminal and at least one output terminal, wherein the output terminal is electrically connected to the patterned conductive layer.

17. The flat display apparatus according to claim 16, wherein the semiconductor circuit unit is disposed on the first surface of the substrate.

18. The flat display apparatus according to claim 16, wherein the patterned conductive layer has a plurality of image inputting pads, and a number of the image inputting pads is equal to a number of a plurality of pixel electrodes.

19. The flat display apparatus according to claim 18, wherein the semiconductor circuit unit has a plurality of image outputting pads electrically connected with the corresponding image inputting pads, respectively.

20. The flat display apparatus according to claim 16, wherein the semiconductor circuit unit comprises a chip.

21. The flat display apparatus according to claim 20, wherein the semiconductor circuit unit further comprises a film, and the chip is disposed on the film and is electrically connected to the patterned conductive layer through the film.

22. The flat display apparatus according to claim 16, wherein the semiconductor circuit unit comprises:
   a transparent substrate having a surface; and
   an integrated circuit formed on the surface of the transparent substrate.

23. The flat display apparatus according to claim 22, wherein the transparent substrate is a glass substrate.

24. The flat display apparatus according to claim 22, wherein the semiconductor circuit unit further comprises a film, the transparent substrate is disposed over the film, and the integrated circuit is electrically connected to the patterned conductive layer through the film.

25. The flat display apparatus according to claim 16, further comprising a flexible printed circuit electrically connected to the input terminal of the semiconductor circuit unit.

26. The flat display apparatus according to claim 16, wherein the substrate is a printed circuit board (PCB) or a flexible printed circuit (FPC).

27. The flat display apparatus according to claim 16, further comprising:
   an opposing electrode unit disposed opposite to the pixel electrode array of the substrate; and
   an opto-electronic display unit disposed between the opposing electrode unit and the pixel electrode array.

28. The flat display apparatus according to claim 27, wherein the opto-electronic display unit comprises an electrophoresis material, an electrowetting material or a liquid crystal material.

29. The flat display apparatus according to claim 16, wherein the auxiliary patterned conductive layer comprises a plurality of auxiliary patterned conductive sub-layers.

30. A flat display apparatus, comprising:
   a substrate having a first surface and a second surface opposite to the first surface;
   a pixel electrode array disposed on the first surface of the substrate;
   a patterned conductive layer disposed on the first surface of the substrate;
   an auxiliary patterned conductive layer disposed on the second surface and electrically connected to the pixel electrode array and the patterned conductive layer; and
   at least a semiconductor circuit unit having at least one input terminal and at least one output terminal, wherein the output terminal is electrically connected to the patterned conductive layer.

31. The flat display apparatus according to claim 30, wherein the semiconductor circuit unit is disposed on the first surface of the substrate.

32. The flat display apparatus according to claim 30, wherein the patterned conductive layer has a plurality of image inputting pads, and a number of the image inputting pads is equal to a number of a plurality of pixel electrodes.

33. The flat display apparatus according to claim 32, wherein the semiconductor circuit unit has a plurality of image outputting pads electrically connected with the corresponding image inputting pads, respectively.

34. The flat display apparatus according to claim 30, wherein the semiconductor circuit unit comprises a chip.

35. The flat display apparatus according to claim 34, wherein the semiconductor circuit unit further comprises a film, and the chip is disposed on the film and is electrically connected to the patterned conductive layer through the film.

36. The flat display apparatus according to claim 30, wherein the semiconductor circuit unit comprises:
   a transparent substrate having a surface; and
   an integrated circuit formed on the surface of the transparent substrate.

37. The flat display apparatus according to claim 36, wherein the transparent substrate is a glass substrate.

38. The flat display apparatus according to claim 36, wherein the semiconductor circuit unit further comprises a film, the transparent substrate is disposed over the film, and the integrated circuit is electrically connected to the patterned conductive layer through the film.

39. The flat display apparatus according to claim 30, further comprising a flexible printed circuit electrically connected to the input terminal of the semiconductor circuit unit.

40. The flat display apparatus according to claim 30, wherein the substrate is a printed circuit board (PCB) or a flexible printed circuit (FPC).

41. The flat display apparatus according to claim 30, further comprising:
   an opposing electrode unit disposed opposite to the pixel electrode array of the substrate; and
   an opto-electronic display unit disposed between the opposing electrode unit and the pixel electrode array.

42. The flat display apparatus according to claim 41, wherein the opto-electronic display unit comprises an electrophoresis material, an electrowetting material or a liquid crystal material.

43. The flat display apparatus according to claim 30, wherein the auxiliary patterned conductive layer comprises a plurality of auxiliary patterned conductive sub-layers.

* * * * *